United States Patent [19]

Lazaroff

[11] Patent Number: 5,581,047
[45] Date of Patent: Dec. 3, 1996

[54] ELECTROMAGNETIC INTERFERENCE SHEILD

[75] Inventor: David I. Lazaroff, Somerville, Mass.

[73] Assignee: Orion Industries Incorporated, Ayer, Mass.

[21] Appl. No.: 191,799

[22] Filed: Feb. 3, 1994

[51] Int. Cl.$^6$ .......................... H05K 9/00; B65D 85/18; B65D 73/00

[52] U.S. Cl. .......................... 174/35 R; 220/6; 220/666; 220/DIG. 21; 206/271; 206/273; 206/275; 206/297; 206/494

[58] Field of Search .......................... 174/35 R, 35 MS, 174/35 GC, 50; 220/230, 638, 666, DIG. 21, 6, 7; 361/816, 818; 334/85; 331/67; 270/39, 40; 206/145, 147, 152, 170, 577, 271, 273, 274, 275, 297, 491, 494, 517

[56] References Cited

U.S. PATENT DOCUMENTS

| | | | |
|---|---|---|---|
| 2,307,076 | 1/1943 | Ray | 93/3 |
| 2,488,710 | 11/1949 | Cooper | 174/35 R |
| 3,006,527 | 10/1961 | Lofquist, Jr. | 229/22 |
| 3,281,058 | 10/1966 | Buttery | 229/51 |
| 3,734,390 | 5/1973 | Buttery et al. | 229/27 |
| 4,019,675 | 4/1977 | Anderson et al. | 229/31 |
| 4,134,497 | 1/1979 | Dlugopolski | 206/521 |
| 4,312,451 | 1/1982 | Forbes, Jr. | 206/628 |
| 4,447,003 | 5/1984 | Gray | 206/268 X |
| 4,765,534 | 8/1988 | Zion et al. | 229/109 |
| 4,816,613 | 3/1989 | Ito et al. | 174/35 R |
| 4,901,911 | 2/1990 | Drexhage | 229/114 |
| 4,951,868 | 8/1990 | Mode | 229/112 |
| 5,316,165 | 5/1994 | Moran, Jr. | 220/62 |
| 5,355,998 | 10/1994 | Bienaime | 206/145 |
| 5,365,410 | 11/1994 | Lonka | 361/816 |

*Primary Examiner*—Bot L. Ledynh
*Attorney, Agent, or Firm*—Hamilton, Brook, Smith & Reynolds, P.C.

[57] ABSTRACT

A blank cut and scored for forming an electromagnetic interference shield is disclosed. The blank includes a rectangular bottom section and has first, second, third and fourth rectangular wall sections, wherein each wall section is joined to a separate side of the rectangular bottom section. Each of the first, second, third and fourth corner sections is formed by coaxial lines extending from the sides of the first, second, third and fourth rectangular wall sections and abut a corner of the rectangular bottom section. A perimeter area is contiguous with the first, second, third and fourth wall sections and first, second, third and fourth corner sections. In each corner section, a line diagonally bisects the corner section from the corner of the rectangular bottom section. First, second, third and fourth corner lines diagonally bisect each respective corner section from the corner of the rectangular bottom section through the abutting corner section into the perimeter area. First, second, third and fourth parallel lines extend from a corner of each corner section into the perimeter area and are parallel with the corner line in each corner section.

16 Claims, 4 Drawing Sheets

ELECTROMAGNETIC INTERFERENCE SHEILD

BACKGROUND OF THE INVENTION

Electronic devices, such as computers, televisions, portable phones and the like, while operating, have components that can emit an electromagnetic radiation field which can interfere with the operation of other electronic components contained in the electronic device. Further, excessive electromagnetic radiation can be harmful to humans. For instance, with portable cellular phones, there have been recent health concerns about the amount of electromagnetic radiation emitted by the phones while they are held close to the head and the possible harm to the operator.

In order to minimize the exposure of electromagnetic radiation to the other electronic components and also to humans, which is required by government regulations, various types of shielding are placed around the electronic components to prevent exposure to this radiation. However, one problem is that the shielding, which must essentially cover the complete component in order to block the electromagnetic radiation, can be bulky. This bulkiness can be detrimental to electronic apparatus that require compact sizes, such as hand-held portable cellular phones, where the spacing between individual components within a device have very close tolerances that require a thin but effective shield.

Therefore, a need exists for a blank that is cut and scored for forming an electromagnetic interference shield which can overcome some of the above-referenced problems.

SUMMARY OF THE INVENTION

The present invention relates to a blank cut and scored for forming an electromagnetic interference shield and a method for forming the shield.

The blank includes a rectangular bottom section and has first, second, third and fourth rectangular wall sections, wherein each wall section is joined to a separate side of the rectangular bottom section. First, second, third and fourth corner sections are formed by coaxial lines extending from the sides of the first, second, third and fourth rectangular wall sections and each corner section abuts a corner of the rectangular bottom section. A perimeter area is contiguous with the first, second, third and fourth wall sections and the first, second, third and fourth corner sections. First, second, third and fourth corner lines are each diagonally bisecting a corner section from a corner of the rectangular bottom section through the abutting corner section into the perimeter area. First, second, third and fourth parallel lines are each parallel to a corner line and extend from a corner of a corner section into the perimeter area which is not a corner through which the corner line bisects the corner section.

This invention has a number of advantages. One advantage is that the blank can be folded about an electronic component that is in the shape of a box. Further, the material with which the blank is made can be folded compactly against the side of the electronic component, thereby allowing the shielded electronic component to be placed compactly within an electronic device requiring close spacing between components while meeting specified emission requirements as set by government agencies.

DETAILED DESCRIPTION OF THE INVENTION

The features and other details of the method and apparatus of the invention will now be more particularly described to the accompanying drawings and pointed out in the claims. The same numerals in different figures represent the same item. It will be understood that the particular embodiments of the invention are shown by way of illustration and not as limitations of the invention. The principle features of this invention can be employed in various embodiments without departing from the scope of the invention.

Figure 1:
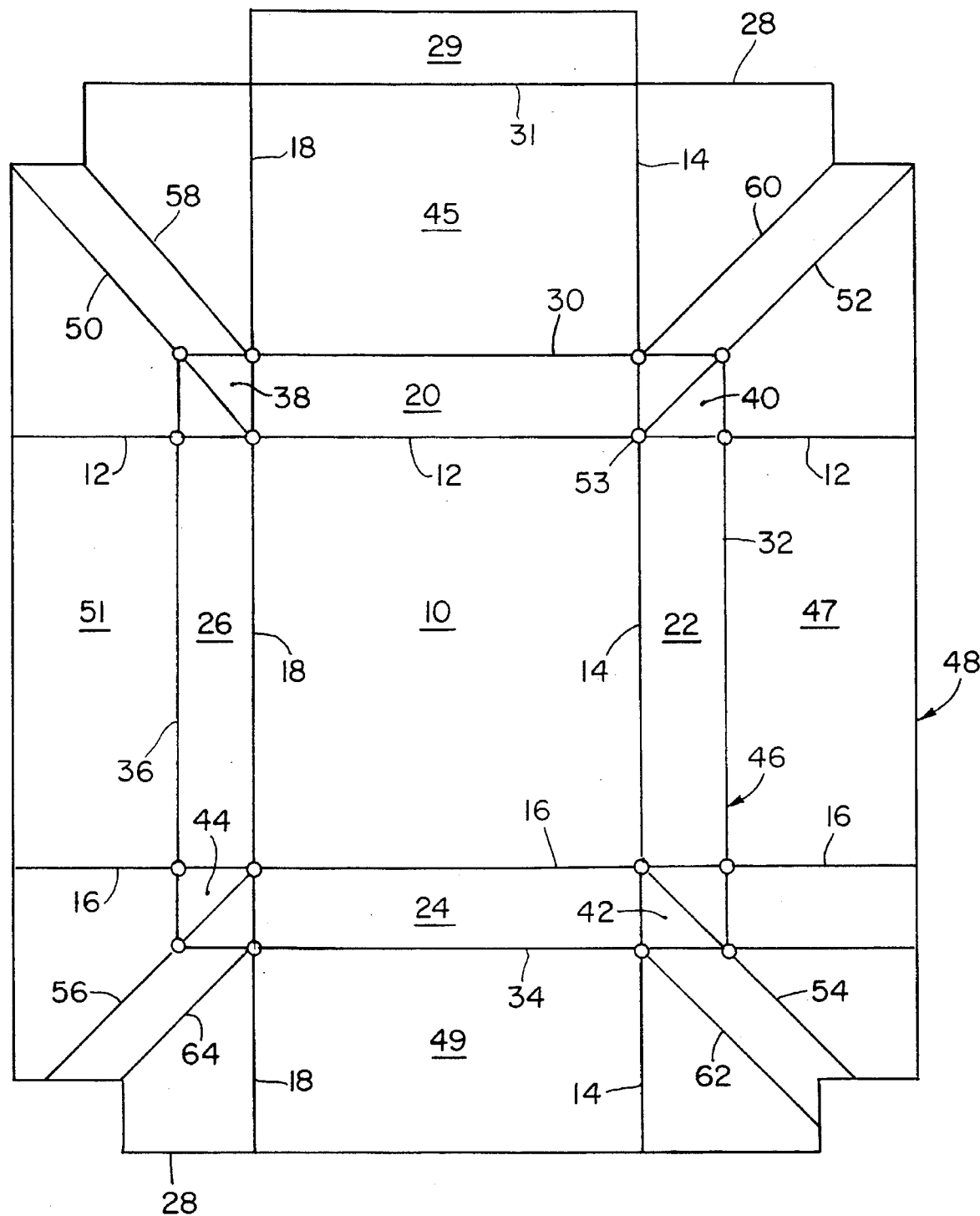
FIG. 1 is a plan view of a cut and scored blank for forming an electromagnetic interference shield.

The present invention relates to a blank for forming an uncut continuous sheet enclosure that folds into a box that is an electrically self-sealing electromagnetic interference shield and a method for forming the shield. The electromagnetic interference shield blank is shown in FIG. 1. The blank is made from a sheet that is sufficiently thick when folded about an electronic component that it provides sufficient shielding to the operator of an electronic device or the adjacent electronic components, or both. Also, the blank can have sections cut out to allow a portion of the electronic component to pass through. For example, a wire can extend from the component to another part of the electronic device. Also, the corners of the blank can be cut out to allow the blank to be more easily folded. The blank can be formed of a laminated sheet having an electrically insulating layer and a conductive layer. Alternatively, the blank is formed of only an insulating layer. The insulating layer is formed of a polymer that has electrically insulative properties. For instance, suitable polymers are selected from a group of polyester, polybutylene teraphthalate, polyvinyl chloride, polyethylene, polypropylene, and polyamide. In one embodiment, the insulative layer has a thickness in the range of between about 0.002 and 0.010 inches. In an preferred embodiment, the insulating layer has a thickness in the range of between about 0.002 and 0.005 inches. The laminate can be formed with a conductive layer on the insulating layer. The conductive layer can be comprised of an electrically conductive metal. This includes metals selected from the group of copper, tin, aluminum and iron. In one embodiment, the conductive layer has a thickness in the range of between about 0.001 and 0.003 inches. The conductive layer forms the outer layer of the shield.

The insulative layer and the conductive layer can be joined by a suitable adhesive. An example of a suitable adhesive includes an acrylic. In one embodiment, the thickness of the adhesive layer is about 0.002 inches.

The blank is cut and scored to provide a rectangular bottom section 10. The scored lines can be perforations. Rectangular bottom section 10 has first rectangular side 12, second rectangular side 14, third rectangular side 16, and fourth rectangular side 18. Sides 12,14,16,18 are dimensioned to the size of the electronic component to be shielded. First rectangular wall section 20 is joined to rectangular bottom section 10 along first rectangular side 12. Similarly, second rectangular wall section 22 is joined to rectangular bottom section 10 at second rectangular side 14. Third rectangular wall section 24 adjoins rectangular bottom section 10 at third rectangular side 16, and fourth rectangular wall section 26 adjoins rectangular bottom section 10 along fourth rectangular side 18. Wall sections 20,22,24,26 are dimensioned to the size of the electronic component to be shielded. The lines of rectangular sides 12,14,16,18 extend to outer perimeter 28 of blank.

The coaxial lines of rectangular sides 12,14,16,18 and upper rectangular sides 30,32,34,36 extend to form first corner section 38, second corner section 40, third corner section 42, and fourth corner section 44. First corner section 38 is formed from the coaxial lines 12,18,30,36 extending from first rectangular wall section 20 and from fourth rectangular wall section 26. Second corner section 40 is formed from coaxial lines 12,14,30,32 that extend from first rectangular wall section 20 and second rectangular wall section 22. Third corner section 42 is formed by coaxial lines 14,16,32,34 extending from second rectangular wall section 22 and third rectangular wall section 24. Fourth corner section 44 is formed by the lines extending from third rectangular wall section 24 and fourth rectangular wall section 26. Also formed by rectangular sides 12,14,16,18, upper rectangular sides 30,32,34,36 and outer perimeter 28 are first outer rectangular 45, second outer rectangular 47, third outer rectangular 49, and fourth outer rectangular 51. Perforations 53 are made at the intersections of rectangular sides 12,14,16,18 and upper rectangular sides 30,32,34,36 to allow for stress relief and easier folding. In one embodiment, the diameter of perforations 53 are about 0.1 inches.

Rectangular wall sections 20,22,24,26 and corner sections 38,40,42,44 form inner perimeter 46. Perimeter area 48 is formed between inner perimeter 46 and outer perimeter 28. First corner line 50 extends from the corner of rectangular bottom section 10 diagonally bisecting first corner section 38 and extends to outer perimeter 28. Second corner line 52 extends from a corner of rectangular bottom section 10 diagonally bisecting corner section 40 and extending to outer perimeter 28 of the blank. Similarly, third corner line 54 extends from a third corner of rectangular bottom section 10 diagonally bisecting third corner section 42 and extending to outer perimeter 28. Fourth corner line 56 extends from a fourth corner of rectangular bottom section 10 diagonally bisecting fourth corner section 44 and extends to outer perimeter 28 of the blank. Flap 29 is joined to first outer rectangular 45 along flap line 31 and can be used for sealing the shield to prevent leakage of electromagnetic radiation by folding along line 31.

First parallel line 58 extends from a corner on corner section 38. First parallel line 58 extends in parallel with but not coaxial with first corner line 50 to outer perimeter 28 of the-blank. Second parallel line 60 extends from a corner of second corner section 40 in parallel with but not coaxial with second corner line 52 and extends to outer perimeter 28 of the blank. Similarly, third parallel line 62 extends from a corner of third corner section 42 in parallel with third corner line 54 but also not coaxial therewith and extends to outer perimeter 28. Fourth parallel line 64 extends from a corner of fourth corner section 44 in parallel with fourth corner line 56 and extends to outer perimeter 28.

Figure 2:
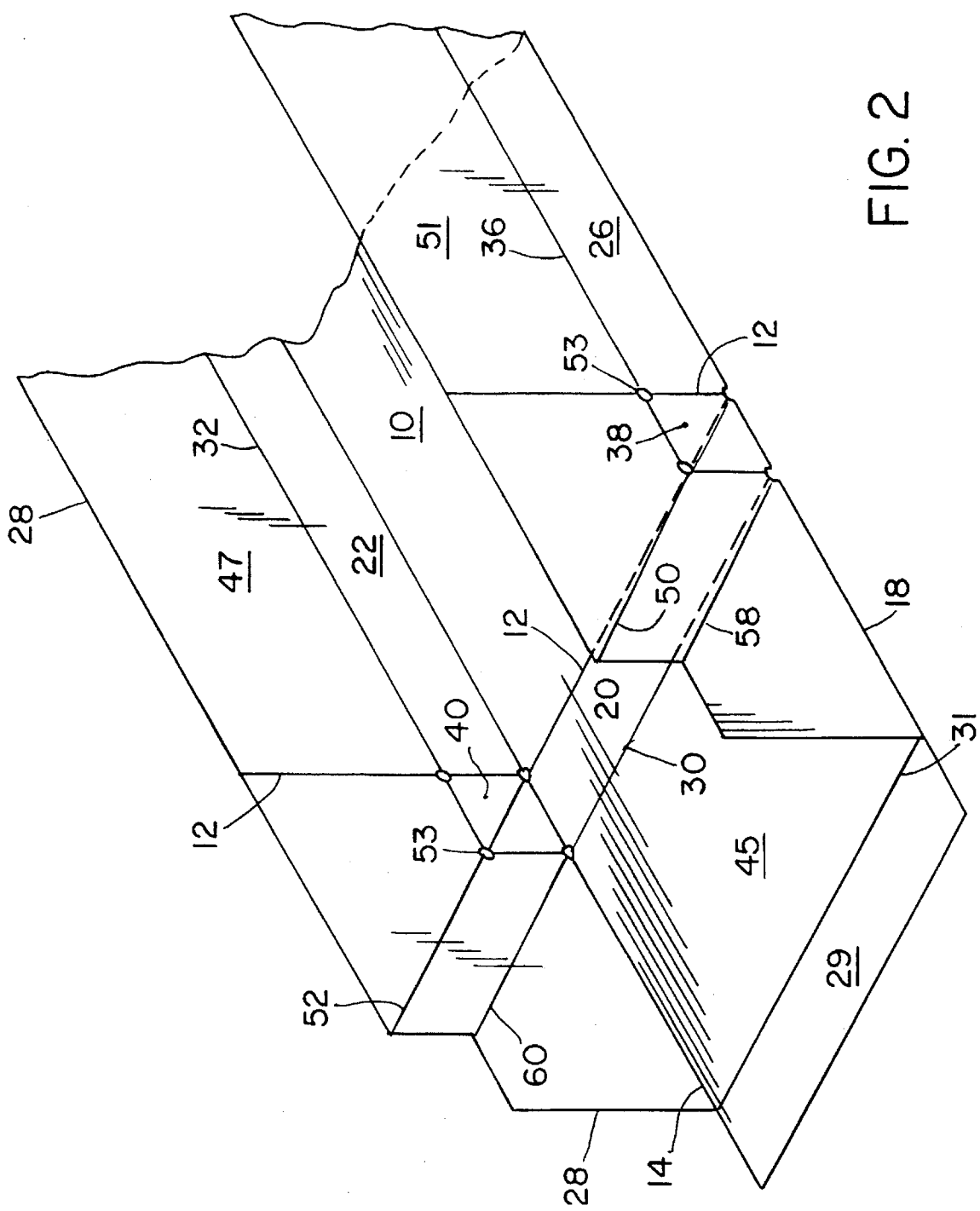
FIG. 2 is a view of one end of a partially folded shield made from the blank of FIG. 1.

As shown in FIG. 2, the blank is partially formed into the electromagnetic interference shield by folding along second rectangular side 14 and fourth rectangular side 18 to form two parallel sides. The component to be shielded, not shown, is placed on rectangular bottom section 10.

Figure 3:
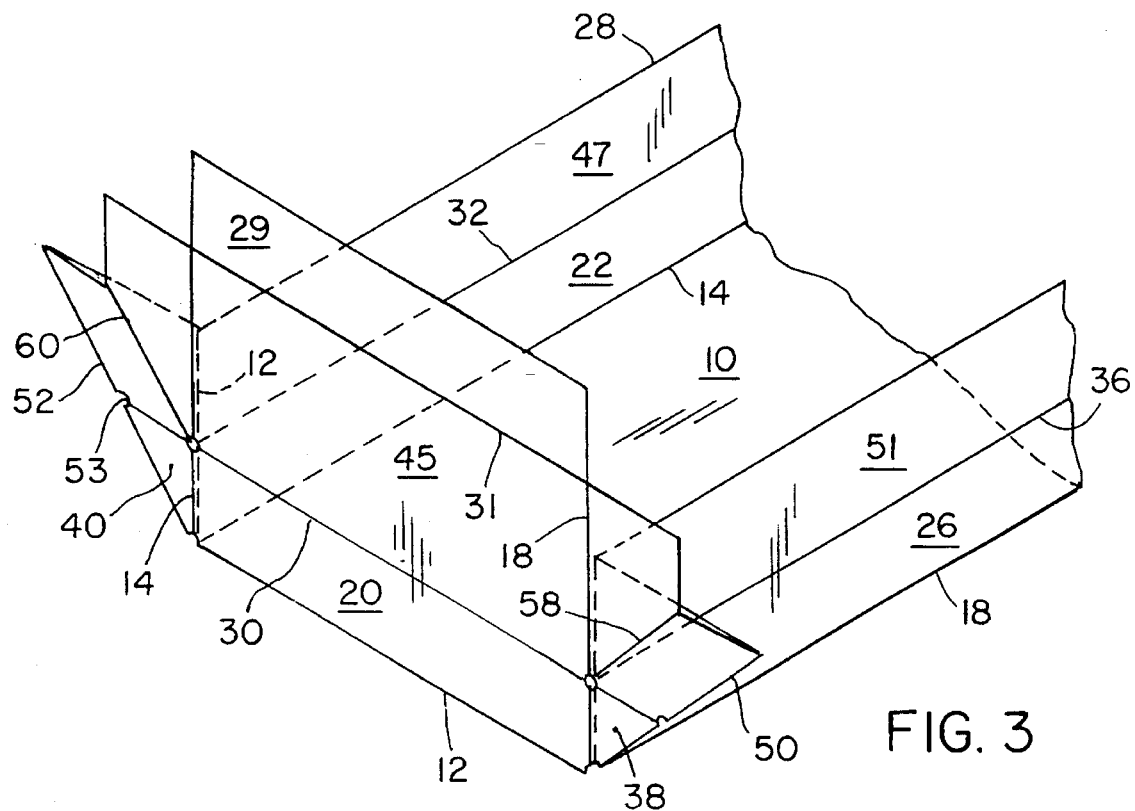
FIG. 3 is the same of the partially folded shield in FIG. 2 but which is further folded than the one displayed in FIG. 2.

In FIG. 3 which shows a further fold, the blank is folded along first corner line 50, first rectangular side 12, and second corner line 52. The area formed between first corner line 50 and first parallel line 58 and the area formed by second corner line 52 and second parallel line 60 extending from first rectangular wall section 20 all lie in the same plane with first rectangular wall section 20.

Figure 4:
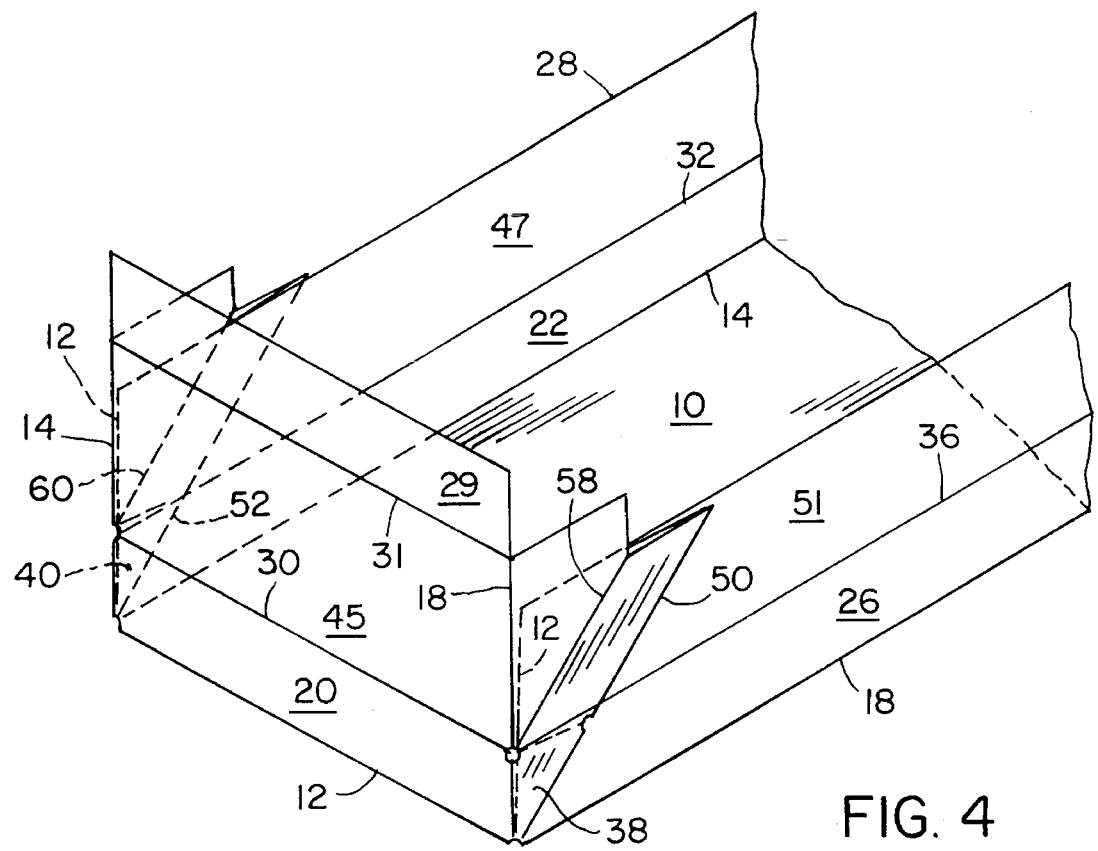
FIG. 4 is the same of the partially folded shield in FIG. 3 but which is further folded than the one displayed in FIG. 3.

As shown in FIG. 4, the area formed by first corner line 50 and first parallel line 58 is folded about the axis, formed by fourth rectangular wall side 18 where joined to first rectangular wall section 20, to fourth rectangular wall section 26, thereby forming a parallel section to fourth rectangular wall section 26. The area formed by second corner line 52 and second parallel line 60 is folded about the axis, formed by second rectangular wall side 14 where joined to first rectangular wall section 20, to second rectangular wall section 22, thereby forming a parallel section to second rectangular wall section 22. Similarly, the other end of the blank is folded as shown in FIGS. 2–4.

Figure 5:
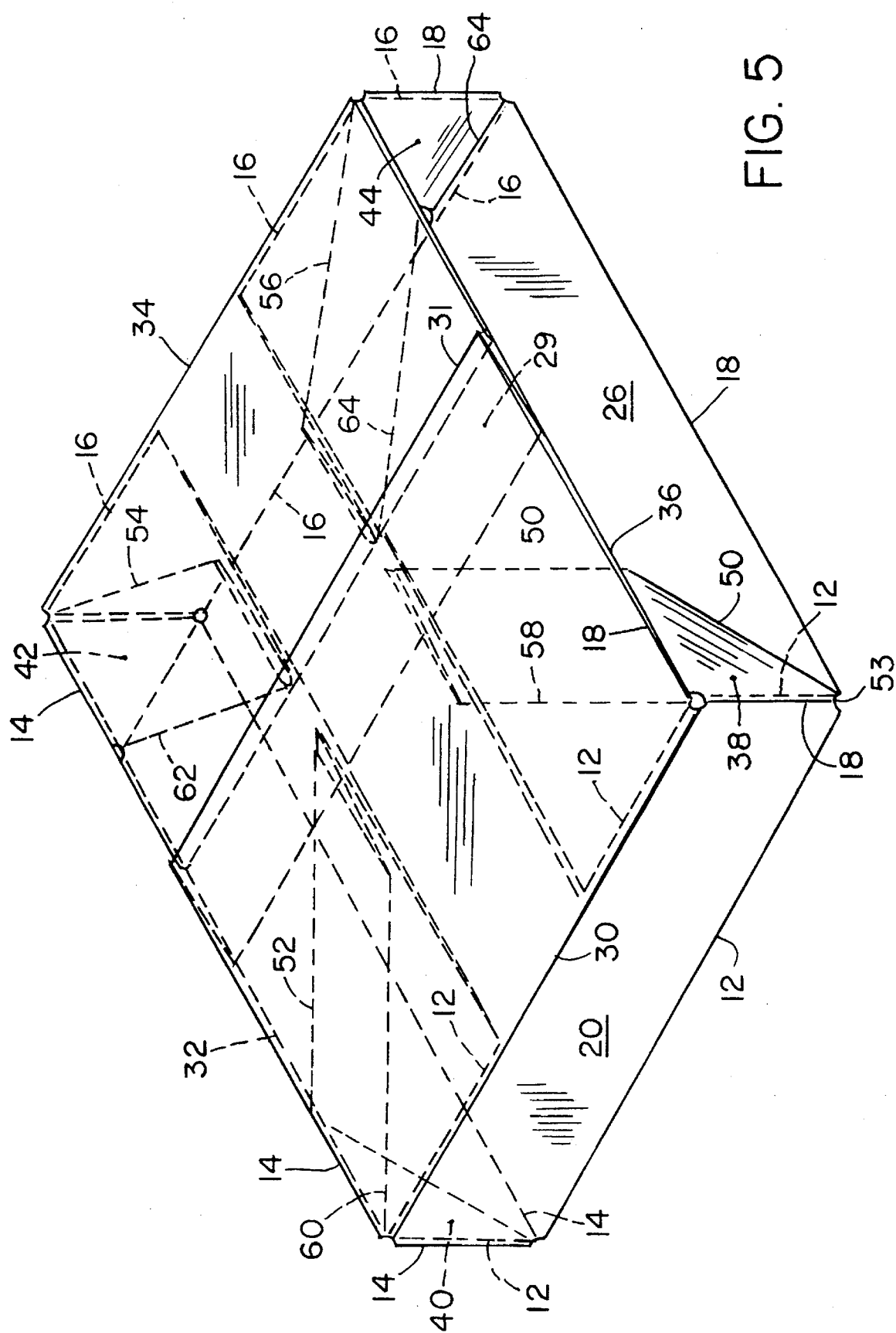
FIG. 5 is the view of a fully folded shield of the blank shown in FIG. 1.

In FIG. 5 which shows the completely folded shield, second outer rectangular 47 is folded along second upper rectangular side 32. Fourth outer rectangular 51 is folded along fourth upper rectangular side 36. Second upper rectangular 47 and fourth outer rectangular 51 are folded toward each other and are normal to their respective rectangular wall sections 22,26. First outer rectangular 45 is then folded along upper rectangular side 30 onto second outer rectangular 47 and fourth outer rectangular 51. As first outer rectangular 45 is folded, first corner line 50 and first parallel line 58 are folded and tucked between first outer rectangular 45 and fourth outer rectangular 51. At the same time, second corner line 52 and second parallel line 60 are folded and tucked between first outer rectangular 45 and second outer rectangular 47. The other end of the blank can be folded in the same manner to form the electromagnetic interference shield.

Flap 29 is folded 180° about flap line 31 to under first outer rectangular section 45 and is contacted with third outer rectangular section 49 to form a conductive seam to prevent leakage of electromagnetic interference. The shield is securely closed by suitable means, such as an adhesive tape, an adhesive rubber band, etc.

Equivalents

Those skilled in the art will recognize, or be able to ascertain using no more than routine experimentation, many equivalents to specific embodiments of the invention described specifically herein. Such equivalents are intended to be encompassed in the scope of the following claims.

I claim:

1. A blank cut and scored for forming an electromagnetic interference shield, comprising:

a) a rectangular bottom section;

b) first, second, third and fourth rectangular wall sections, wherein each said wall section is joined to a separate side of said rectangular bottom section;

c) first, second, third and fourth corner sections, wherein each said corner section is formed by coaxial lines extending from the sides of the first, second, third and fourth rectangular wall sections and each said corner section abuts a corner of the rectangular bottom section and is contiguous with the said rectangular wall section;

d) a perimeter area contiguous with said first, second, third and fourth rectangular wall sections and said first, second, third and fourth corner sections;

e) first, second, third and fourth corner lines, wherein each said corner line diagonally bisects said first, second, third and fourth corner sections, respectively, from the corner of the rectangular bottom section through said abutting corner section into said perimeter area; and f) first, second, third and fourth parallel lines, wherein each parallel line is parallel f) first, second, third and fourth parallel lines, wherein each parallel line is parallel and not coaxial to said first, second, third and fourth corner lines, respectively, and extends from a corner of each corner section, respectively, into said perimeter area and which is not a corner through which the respective corner line bisects said respective corner section.

2. A blank of claim 1 wherein the first parallel line and the second parallel line extend from the first rectangular wall section and the third parallel line and the fourth parallel line extend from the rectangular wall section that is at the opposite end of the rectangular bottom section.

3. A blank of claim 2 wherein a flap abuts the perimeter area.

4. A blank of claim 3 wherein the lines are perforated.

5. A blank of claim 4 wherein at each point of intersection of the scored coaxial lines is a perforation.

6. A blank of claim 1 wherein the blank is formed of a laminated sheet having an insulating layer and a conductive layer.

7. A blank of claim 6 wherein the insulating layer is comprised of an insulative polymer.

8. A blank of claim 7 wherein the insulative polymer is selected from the group of polyester, polybutylene teraphthalate, polyvinyl chloride, polyethylene, polypropylene, and polyamide.

9. A blank of claim 8 wherein the conductive layer is comprised of a conductive metal.

10. A blank of claim 9 wherein the conductive metal is selected from the group of copper, tin, aluminum, and iron.

11. A blank of claim 10 wherein the insulative layer and the conductive layer are joined by an adhesive.

12. A blank of claim 11 wherein the adhesive is an acrylic adhesive.

13. A blank cut and scored for forming a wrap around a box, comprising:

a) a bottom section;

b) a plurality of wall sections, wherein each said section is contiguous to a side of said bottom section;

c) a plurality of corner sections, wherein each corner section abuts a corner of the bottom section and is formed by the coaxial lines extending from the sides of the wall sections;

d) a perimeter area contiguous with the wall sections and the corner sections;

e) a plurality of corner lines, wherein each extends from a corner of the bottom second and bisects diagonally the respective abutting corner section; and f) a plurality of parallel and non-coaxial lines, wherein each said parallel and non-axial line extends respectively from a second corner of said corner section which extends from the second corner in parallel and non-coaxially with the corner line extending from the same corner section.

14. A blank of claim 13 wherein a first parallel corner line and a second parallel corner line extend from a wall section and a third parallel corner line and a fourth corner line extend from a second wall section that is at the opposite end of the bottom section.

15. A method for forming an electromagnetic shield from a cut and scored blank, comprising the steps of:

a) folding a blank having i) a rectangular bottom section, ii) first, second, third and fourth rectangular wall sections, wherein each said wall section is joined to a separate side of said rectangular bottom section, iii) first, second, third and fourth corner sections, wherein each said corner section is formed by the coaxial lines extending from the sides of the first, second, third and fourth rectangular wall sections and each said corner section abuts a corner of the rectangular bottom section and is contiguous with the said rectangular wall section, contiguous with the said rectangular wall section, iv) a perimeter area contiguous with said first, second, third and fourth rectangular wall sections and said first, second, third and fourth corner sections, v) first, second, third and fourth corner lines, wherein each said corner line diagonally bisects respectively a corner section from the corner of the rectangular bottom section through said abutting corner section into said perimeter area, and vi) first, second, third and fourth parallel and non-coaxial lines, wherein each parallel and non-coaxial line is respectively parallel and non-axial to said corner line and extends from a corner of said corner section into said perimeter area and which is not a corner through which the corner line bisects said corner section, wherein said blank is folded along the scored line between the second rectangular wall section and rectangular bottom section and the scored line between the fourth rectangular wall section and rectangular bottom section to form first and second normal planes to the rectangular bottom section, whereby the diagonal lines are on the normal planes;

b) folding the scored line between the first rectangular wall section and rectangular bottom section and along the first and second diagonal corner lines, whereby the first rectangular wall section is normal to the rectangular bottom section;

c) folding the scored line between the third rectangular wall section and rectangular bottom section and along the third and fourth diagonal corner lines, whereby the third rectangular wall section is normal to the rectangular bottom section;

d) folding the scored line between the second rectangular wall section and the perimeter area adjoining the second rectangular wall section and the scored line between the fourth rectangular wall section and the perimeter area adjoining the fourth rectangular wall section, whereby the perimeter area adjoining the second rectangular wall section and the perimeter area adjoining the fourth rectangular wall section are folded toward each other and normal to the respective wall sections;

e) folding the scored line between the third rectangular wall section and the perimeter area adjoining third rectangular wall section, whereby the perimeter area adjoining the third rectangular wall section is folded onto the perimeter area adjoining the second rectangular wall section and the perimeter area adjoining the fourth rectangular wall section while the third and fourth section lines and the third and fourth corner lines are folded between the perimeter area adjoining the third rectangular wall section and the perimeter areas adjoining the second rectangular wall section and the fourth rectangular wall section; and f) folding the scored line between the first rectangular wall section and the perimeter area adjoining the first rectangular wall section, whereby the perimeter area adjoining the first rectangular wall section is folded onto the perimeter area adjoining the second rectangular wall section and the perimeter area adjoining the fourth rectangular wall section while the first and second section lines and the first and second corner lines are folded between the perimeter area adjoining the third rectangular wall section and the perimeter areas adjoining the second rectangular wall section and the fourth rectangular wall section, thereby forming an electromagnetic shield from a cut and scored blank.

16. A method of claim 15 wherein the blank has a flap having a flap line abutting the perimeter area, said flap is folded about the flap line.

* * * * *

UNITED STATES PATENT AND TRADEMARK OFFICE
CERTIFICATE OF CORRECTION

PATENT NO. : 5,581,047
DATED : December 3, 1996
INVENTOR(S) : David I. Lazaroff

It is certified that error appears in the above-indentified patent and that said Letters Patent is hereby corrected as shown below:

On the cover page, in the Title [54]:  Delete the word "Sheild" and insert therefor --Shield--;

In Column 1, line 2:  Delete the word "Sheild" and insert therefor --Shield ; and In Column 5:  Delete lines 6 and 7.

Signed and Sealed this

Twenty-fifth Day of February, 1997

Attest:

BRUCE LEHMAN

Attesting Officer  Commissioner of Patents and Trademarks